(12) United States Patent
Chuang et al.

(10) Patent No.: US 9,708,727 B2
(45) Date of Patent: Jul. 18, 2017

(54) STIRRING APPARATUS OF INGOT CASTING FURNACE

(71) Applicant: GLOBALWAFERS CO., LTD., Hsinchu (TW)

(72) Inventors: Lu-Chung Chuang, Hsinchu (TW); Chih-Chieh Yu, Hsinchu (TW); Wen-Chieh Lan, Hsinchu (TW); Jiunn-Yih Chyan, Hsinchu (TW); I-Ching Li, Hsinchu (TW); Wen-Ching Hsu, Hsinchu (TW)

(73) Assignee: GLOBALWAFERS CO., LTD., Hsinchu Science Park (TW)

( * ) Notice: Subject to any disclaimer, the term of this patent is extended or adjusted under 35 U.S.C. 154(b) by 80 days.

(21) Appl. No.: 14/684,355

(22) Filed: Apr. 11, 2015

(65) Prior Publication Data

US 2015/0299895 A1     Oct. 22, 2015

(30) Foreign Application Priority Data

Apr. 18, 2014    (TW) .............................. 103206797 U

(51) Int. Cl.
*C30B 15/30*    (2006.01)
*C30B 11/00*    (2006.01)
*C30B 11/06*    (2006.01)
*C30B 29/06*    (2006.01)

(52) U.S. Cl.
CPC .......... *C30B 11/007* (2013.01); *C30B 11/065* (2013.01); *C30B 15/305* (2013.01); *C30B 29/06* (2013.01); *Y10T 117/1024* (2015.01)

(58) Field of Classification Search
CPC .................... C30B 15/305; Y10T 117/1024
See application file for complete search history.

(56) References Cited

U.S. PATENT DOCUMENTS

| 4,355,906 A * | 10/1982 | Ono ...................... B01F 7/0005 366/274 |
| 5,788,764 A * | 8/1998 | Sato ........................ C30B 15/00 117/28 |
| 6,059,876 A * | 5/2000 | Yin ......................... C30B 15/04 117/19 |
| 6,244,741 B1 * | 6/2001 | Akamine ............ B01F 7/00291 366/307 |
| 2005/0139148 A1 * | 6/2005 | Fujiwara ............... C01B 33/037 117/13 |
| 2009/0314996 A1 * | 12/2009 | Kawazoe ................ C30B 15/04 252/500 |

* cited by examiner

*Primary Examiner* — Matthew Song
(74) *Attorney, Agent, or Firm* — Tracy M. Heims; Apex Juris PLLC

(57) ABSTRACT

A stirring apparatus of an ingot casting furnace includes a rotating shaft and at least one fin. The fin is provided onto the rotating shaft, and has a first edge, a second edge of unequal length provided correspondingly, and a third edge connecting the first and the second edges. The rotating shaft can be driven to rotate, which consequently drives the at least one fin to stir materials in a crucible. The length of the first edge is different from that of the second edge in order for the materials in the crucible can be mixed with dopants more uniformly during the stirring process to produce ingots of stable quality.

7 Claims, 4 Drawing Sheets

STIRRING APPARATUS OF INGOT CASTING FURNACE

BACKGROUND OF THE INVENTION

1. Technical Field

The present invention relates generally to an apparatus for crystal growth, and more particularly to a stirring apparatus of an ingot casting furnace.

2. Description of Related Art

An ingot casting furnace is used to produce boules by melting solid materials into liquid state, in which seeds are immersed for crystal growth. A conventional ingot casting furnace includes a crucible, a dome, and a container, wherein the container is hung under the dome to house dopants. Dopants which are vaporized at a high temperature would diffuse into the crucible to be mixed with melted materials to start the process of crystal growth to produce boules, and the produced boules can then be cut to manufacture wafers. However, vaporized dopants tend to accumulate on the upper surface of melted materials, and it is difficult for vaporized dopants to get deeper into melted materials merely by diffusion. Therefore, a boule with uniformly mixed dopants is almost impossible to be produced in this way.

To improve the aforementioned defect, some manufacturers in the industry have proposed to provide a stirring apparatus in the crucible in attempt to uniformly mix dopants in melted materials. Taiwan utility model patent No. M430697 discloses an example of such a stirring apparatus. An ingot casting furnace disclosed in said patent includes a stirring apparatus provided in a crucible, wherein the stirring apparatus is driven by mechanical force to stir materials in the crucible to make vaporized dopants uniformly mixed therein. However, the disclosed stirring apparatus has a plurality of fins installed on the wall of a dome, and such design would increase the difficulty of manufacturing due to the complexity of components. Not only that, in practice, the fins are usually made of quartz, which is a different material from that of the dome, and therefore it is burdensome to work on these two kinds of components to engage them together. Therefore, there is still room for improvements in the design of conventional ingot casting furnaces.

BRIEF SUMMARY OF THE INVENTION

In view of the above, the primary objective of the present invention is to provide a stirring apparatus of an ingot casting furnace, which is capable of uniformly mixing dopants into materials in a crucible to produce boules of stable quality.

The stirring apparatus of an ingot casting furnace provided in the present invention includes a rotating shaft and at least one fin. The at least one fin is provided on the rotating shaft, wherein the at least one fin has a first edge and a second edge which correspond to each other, and have unequal lengths.

In an embodiment, the at least one fin has a third edge away from the rotating shaft, wherein two ends of the third edge are respectively connected to the first edge and the second edge. The first edge and the second edge are parallel to each other, and the length of the first edge is either greater or less than the length of the second edge.

Furthermore, the third edge has at least one straight segment, or has at least one curved segment, which contributes to provide stronger effect of turbulence.

By stirring materials in the crucible with the stirring apparatus, dopants can be uniformly mixed in the materials to produce boules of stable quality.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
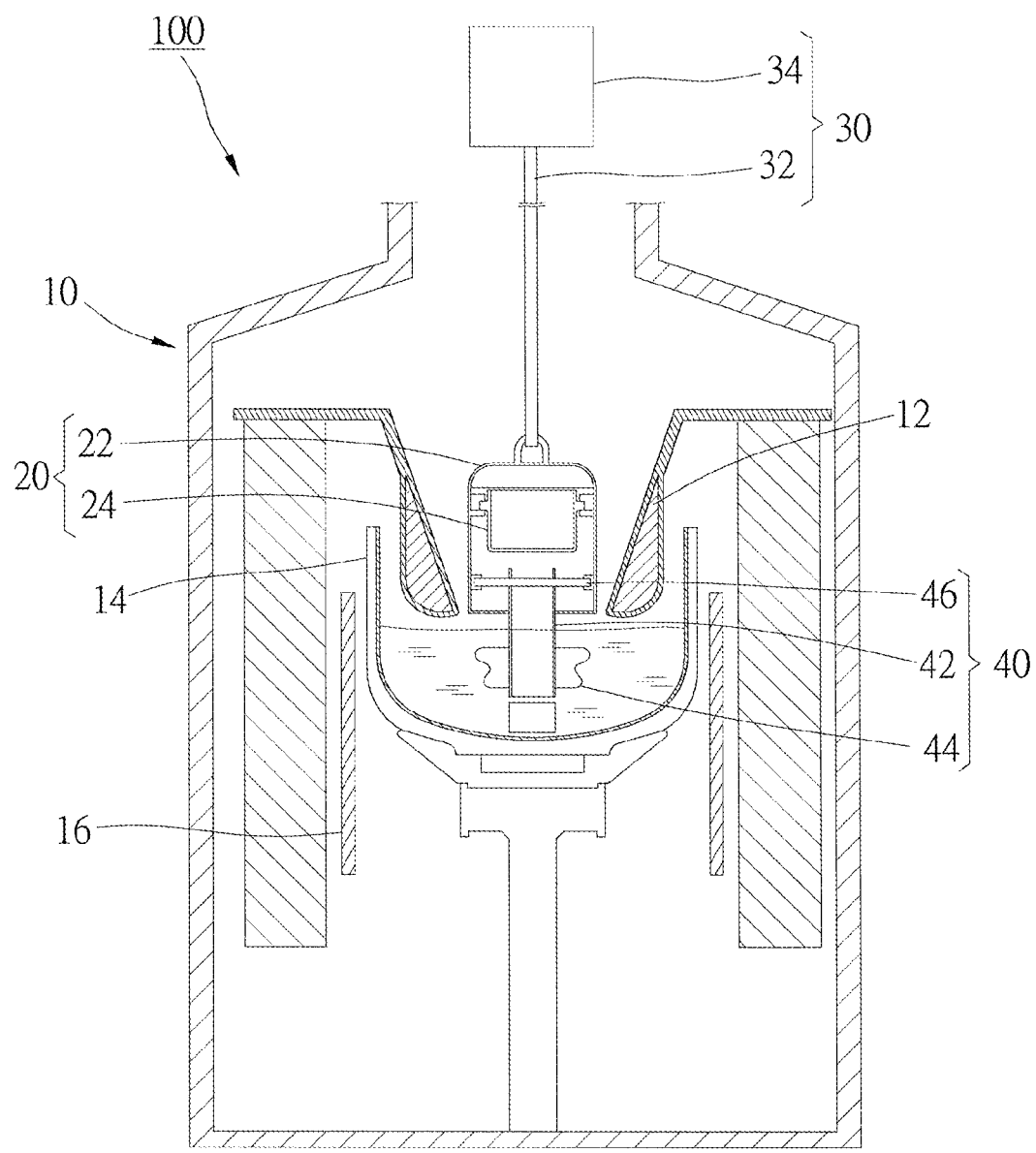
FIG. 1 is a sectional view showing an ingot casting furnace applied with a first preferred embodiment of the present invention.

As shown in FIG. 1, a stirring apparatus 40 of the first preferred embodiment of the present invention is applied in an ingot casting furnace 100, which includes a furnace body 10, a doping jar 20, and a driving device 30.

The furnace body 10 includes a thermal insulating cover 12, a crucible 14, and a plurality of heaters 16, wherein the crucible 14 is provided for housing silicon materials in liquid state, and the heaters 16 are installed around the crucible 14 to heat the crucible 14 to keep the silicon materials inside staying in liquid state. The thermal insulating cover 12 is provided above the crucible 14 for heat preservation, which ensures the subsequent process of crystal growth performed smoothly. The doping jar 20 includes a dome 22 and a container 24, wherein the container 24 is provided inside the dome 22, and houses dopants which can be vaporized. The vaporized dopants are supposed to be mixed into the silicon materials in the crucible 14. The driving device 30 includes a transmission rod 32 and a motor 34, wherein the transmission rod 32 is connected to the dome 22 with an end thereof. The motor 34 drives the transmission rod 32 to move the dome 22 along with the container 24.

The stirring apparatus 40 of the first preferred embodiment includes a rotating shaft 42 and four fins 44. However, there can be more or fewer fins 44 in practice to meet different requirements. The rotating shaft 42 is hung in the dome 22 with a support 46. The fins 44 are integrally connected on a surface of the rotating shaft 42, and are radially arranged. By definition, each of the fins 44 has a first edge 44a, a second edge 44b, and a third edge 44c on an outline thereof, wherein the first edge 44a and the second edge 44b are parallel to each other, and a length of the first edge 44a is greater than a length of the second edge 44b. The third edge 44c has a curved segment in the first preferred embodiment, and two ends of the third edge 44c are respectively connected to the first edge 44a and the second edge 44b. In other words, most of the distances between a central axis L of the rotating shaft 42 to any points on the third edge 44c of each of the fins 44 are different.

Figure 2:
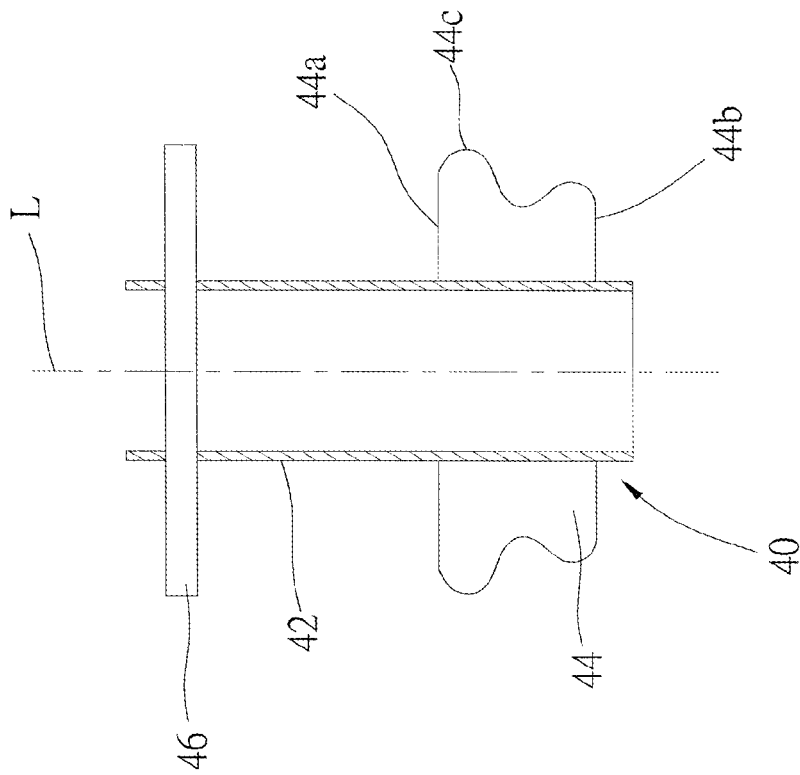
FIG. 2 is a schematic view of the first preferred embodiment of the present invention.

As shown in FIG. 1 and FIG. 2, when the motor 34 drives the transmission rod 32 to move the dome 22 along with the stirring apparatus 40, the fins 44 stir the silicon materials in the crucible 14 to uniformly mix the vaporized dopants thereinto. In particular, for the lengths of the first edge 44a and the second edge 44b of each of the fins 44 are unequal, most of the distances between the central axis L of the rotating shaft 42 to any points on the third edge 44c are unequal as well. As a result, angular velocity and angular momentum at different sections on each of the fins 44 are different, and therefore the silicon materials above, below or beside each of the fins 44 are provided with effect of turbulence of different extent. Such design contributes to mix the dopants and the silicon materials more uniformly to produce boules of stable quality.

Figure 3:
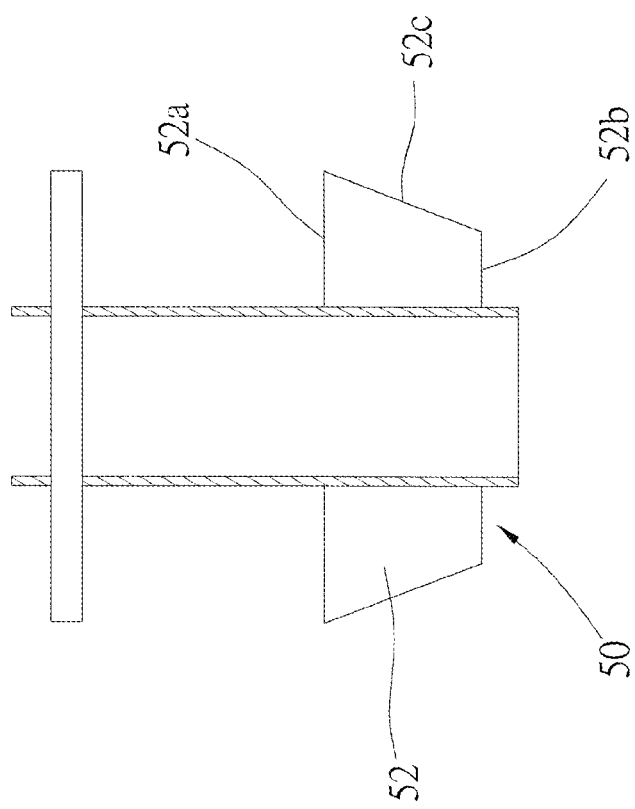
FIG. 3 is a schematic view of a second preferred embodiment of the present invention.

Several preferred embodiments which provide the same function are described below. As shown in FIG. 3, a stirring apparatus 50 of the second preferred embodiment of the present invention includes fins 52 having a first edge 52a longer than a second edge 52b. The difference between the second preferred embodiment and the aforementioned first preferred embodiment is that each of the fins 52 of the stirring apparatus 50 has a straight segment on a third edge 50c thereof. Similarly, for each of the fins 52, due to the unequal lengths of the first edge 52a and the second edge 52b, the distances between the central axis L of the rotating shaft 42 to any points on the third edge third edge 52c are all unequal as well. According to the reason explained above, angular velocity and angular momentum at different sections on each of the fins 52 are different, too.

Figure 4:
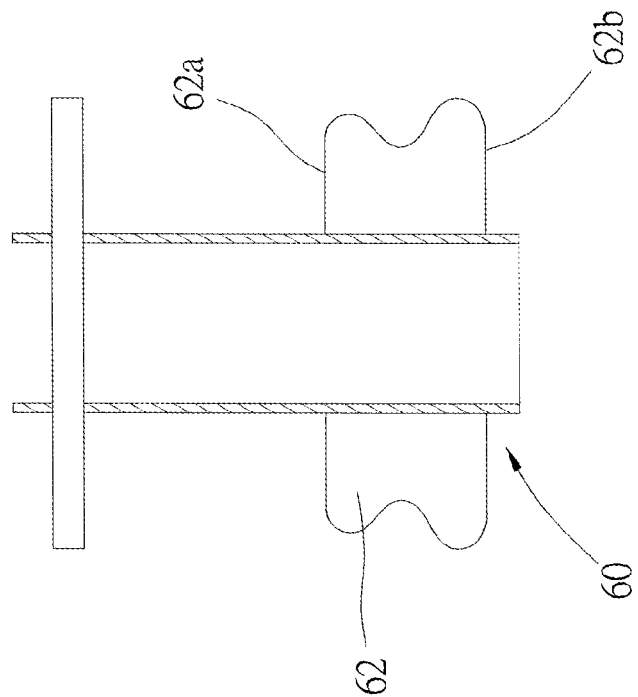
FIG. 4 is a schematic view similar to FIG. 2, showing a third preferred embodiment of the present invention.
Figure 5:
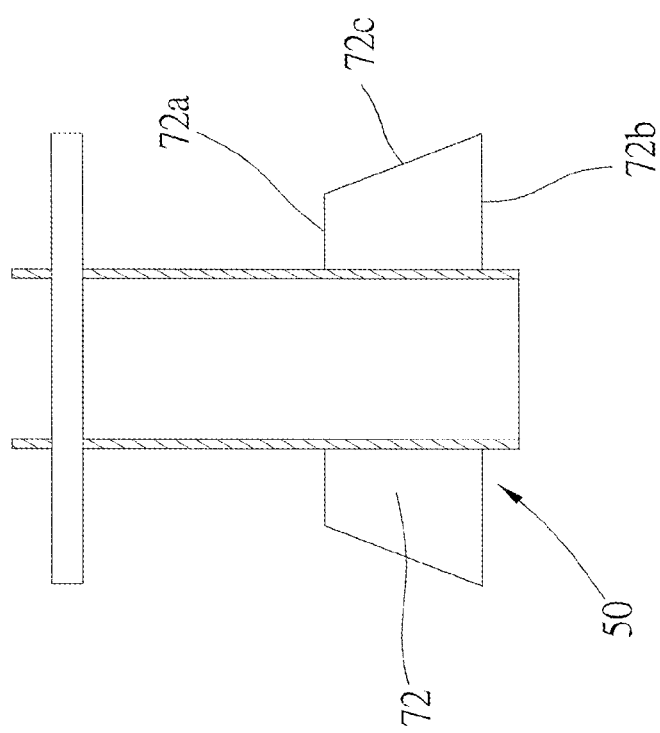
FIG. 5 is a schematic view similar to FIG. 4, showing a fourth preferred embodiment of the present invention.

A stirring apparatus 60 of the third preferred embodiment of the present invention is shown in FIG. 4, while a stirring apparatus 70 of the fourth preferred embodiment of the present invention is shown in FIG. 5. Different from the aforementioned two preferred embodiments, the third preferred embodiment and the fourth preferred embodiment both have a first edge shorter than a second edge. Specifically, for each of fin 62 of the stirring apparatus 60, a length of a first edge 62a thereof is less than that of a second edge 62b thereof, and a third edge 62c thereof has a curved segment; for each of fin 72 of the stirring apparatus 70, a length of a first edge 72a thereof is less than that of a second edge 72b thereof, and a third edge 72c thereof has a straight segment.

In addition, the fins in the aforementioned embodiments are made of quartz, which are easy to be manufactured and installed.

Figure 6:
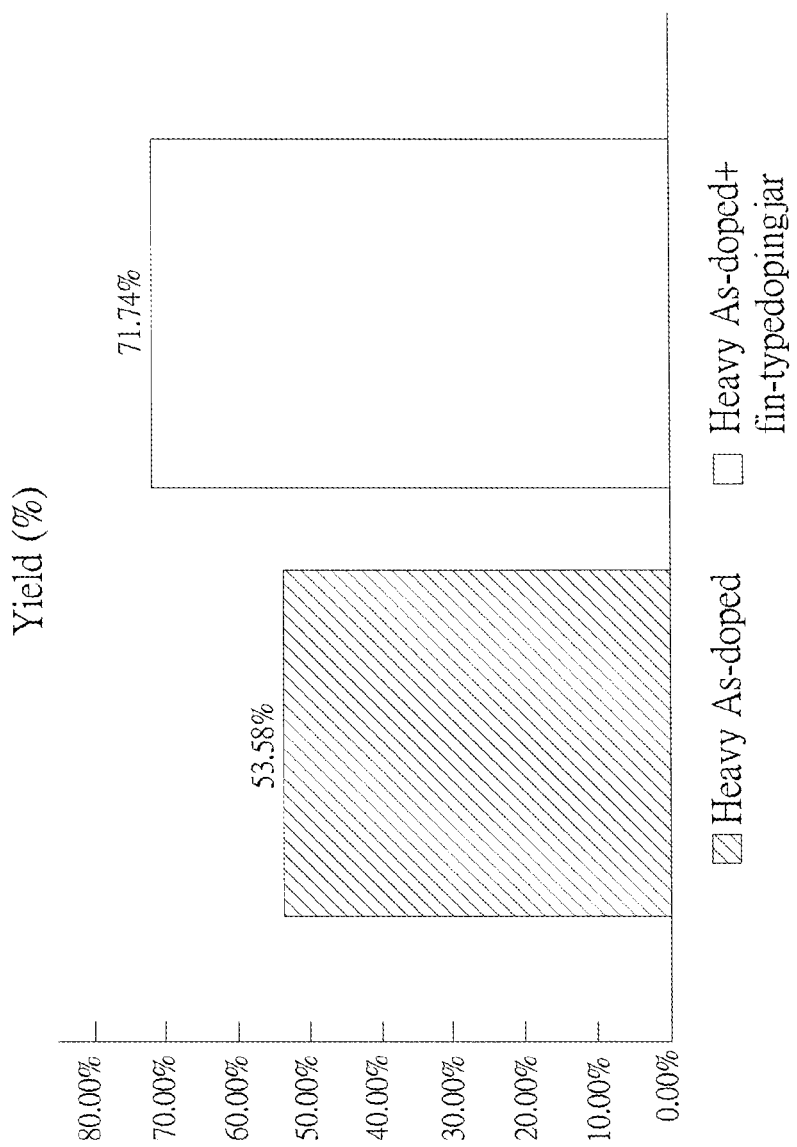
FIG. 6 is a schematic view showing experimental yields.

It is worth mentioning that, as proved by experiments and shown in FIG. 6, the yield of dopants and silicon materials which are mixed by using the stirring apparatus provided in the present invention is increase to 71.74% from 53.58%. Therefore, the chances of breaking wire while working on boules are effectively reduced.

It must be pointed out that the embodiments described above are only some preferred embodiments of the present invention. All equivalent structures which employ the concepts disclosed in this specification and the appended claims should fall within the scope of the present invention.

What is claimed is:

1. A stirring apparatus of an ingot casting furnace, wherein the ingot casting furnace includes a crucible, a dome, and a transmission rod; the crucible is provided for housing liquid materials for casting the ingot; the dome is provided for housing dopants which can be vaporized; the transmission rod is connected to the dome with an end thereof for moving the dome; the stirring apparatus comprising:
    a support connected to an inner wall of the dome with two ends thereof;
    a rotating shaft having two ends, wherein one of the two ends is fixed to the support, the other one of the two ends is provided outside the dome and extends into the crucible;
    at least one fin provided on the other one of the two ends of the rotating shaft, wherein the at least one fin has a first edge and a second edge which correspond to each other, and have unequal lengths.

2. The stirring apparatus of claim 1, wherein the at least one fin has a third edge away from the rotating shaft; two ends of the third edge are respectively connected to the first edge and the second edge; the first edge and the second edge are parallel to each other, and the length of the first edge is greater than the length of the second edge.

3. The stirring apparatus of claim 2, wherein the third edge has at least one straight segment.

4. The stirring apparatus of claim 2, wherein the third edge has at least one curved segment.

5. The stirring apparatus of claim 1, wherein the at least one fin has a third edge away from the rotating shaft; two ends of the third edge are respectively connected to the first edge and the second edge; the first edge and the second edge are parallel to each other, and the length of the first edge is less than the length of the second edge.

6. The stirring apparatus of claim 5, wherein the third edge has at least one straight segment.

7. The stirring apparatus of claim 5, wherein the third edge has at least one curved segment.

* * * * *